United States Patent
Takeda

(10) Patent No.: US 7,468,143 B2
(45) Date of Patent: Dec. 23, 2008

(54) PIEZOELECTRIC CERAMIC COMPOSITION AND PIEZOELECTRIC ELEMENT

(75) Inventor: Toshikazu Takeda, Omihachiman (JP)

(73) Assignee: Murata Manufacturing Co., Ltd., Nagaokakyo-Shi (JP)

(*) Notice: Subject to any disclaimer, the term of this patent is extended or adjusted under 35 U.S.C. 154(b) by 169 days.

(21) Appl. No.: 11/655,857

(22) Filed: Jan. 22, 2007

(65) Prior Publication Data

US 2007/0131895 A1   Jun. 14, 2007

Related U.S. Application Data

(63) Continuation of application No. PCT/JP2005/011723, filed on Jun. 27, 2005.

(30) Foreign Application Priority Data

Aug. 18, 2004   (JP) .............................. 2004-238457
Mar. 29, 2005   (JP) .............................. 2005-096121

(51) Int. Cl.
*H01L 41/187* (2006.01)
*C04B 35/495* (2006.01)

(52) U.S. Cl. .................. 252/62.9 R; 501/134; 310/311; 310/366; 310/365

(58) Field of Classification Search ............ 252/62.9 R; 501/134; 310/311, 366, 365
See application file for complete search history.

(56) References Cited

U.S. PATENT DOCUMENTS

| | | | | |
|---|---|---|---|---|
| 6,083,415 A | * | 7/2000 | Kimura et al. | 252/62.9 R |
| 6,093,339 A | * | 7/2000 | Kimura et al. | 252/62.9 R |
| 6,503,416 B2 | * | 1/2003 | Takeda et al. | 252/62.9 R |
| 6,956,001 B2 | * | 10/2005 | Hoffmann et al. | 501/134 |
| 2004/0048732 A1 | | 3/2004 | Hoffmann et al. | |
| 2006/0066180 A1 | * | 3/2006 | Nanataki et al. | 310/358 |

FOREIGN PATENT DOCUMENTS

| DE | 101 41 293 A1 | 5/2002 |
|---|---|---|
| JP | 2000-143339 | 5/2000 |
| JP | 2002-68836 | 3/2002 |
| JP | 2002-321975 | 11/2002 |

OTHER PUBLICATIONS

Written Opinion of the International Searching Authority dated Sep. 20, 2005.

* cited by examiner

*Primary Examiner*—C. Melissa Koslow
(74) *Attorney, Agent, or Firm*—Dickstein, Shapiro, LLP.

(57) ABSTRACT

The piezoelectric ceramic composition of the present invention contains a main component represented by general formula $\{(1-n)(Ag_{1-x}Li_x)_m(Nb_{1-y}Ta_y)O_3\text{-}n(M1,M2)M3M3O_3\}$ or $\{(1-n)(Ag_{1-x}Li_x)_m(Nb_{1-y}Ta_y)O_3\text{-}nM4M5O_3\}$ and x, y, m, and n are defined to be $0.075 \leq x < 0.40$, $0 \leq y < 0.2$, $0.98 \leq m \leq 1.0$, and $0.01 \leq n \leq 0.1$. M1 is a trivalent metal element such as Bi; M2 is a monovalent metal element such as K, Na, Li or Ag; M3 and M5 each are a tetravalent metal element such as Ti, Zr, Sn or Hf; and M4 is a divalent metal element such as Ba, Sr, Ca, or Mg. With this composition, an highly reliable lead-free piezoelectric ceramic composition having a high relative dielectric constant and good piezoelectric properties such as electromechanical coupling factor $k_{33}$ and piezoelectric constant $d_{33}$ can be provided, and a highly reliable lead-free piezoelectric element can be fabricated using the piezoelectric ceramic composition.

19 Claims, 1 Drawing Sheet

PIEZOELECTRIC CERAMIC COMPOSITION AND PIEZOELECTRIC ELEMENT

This is a continuation of application Serial No. PCT/JP2005/011723, filed Jun. 27, 2005.

TECHNICAL FIELD

The present invention relates to piezoelectric ceramic compositions and piezoelectric elements. More specifically, the present invention relates to lead-free piezoelectric ceramic compositions which can be used in a variety of piezoelectric elements and relates to piezoelectric elements such as piezoelectric oscillators, piezoelectric actuators, piezoelectric filters, piezoelectric buzzers and piezoelectric sensors fabricated using the piezoelectric ceramic compositions.

BACKGROUND ART

As raw materials for piezoelectric elements such as piezoelectric oscillators, piezoelectric ceramic compositions including $Pb(Ti,Zr)O_3$ (lead titanate zirconate) or $PbTiO_3$ (lead titanate) as a main component have been widely used. However, these are not preferable from the environmental point of view since these types of piezoelectric ceramic compositions contain a Pb component. Therefore, lead-free piezoelectric materials not containing a Pd component have been recently required.

Consequently, a piezoelectric ceramic composition including a main component having a composition represented by general formula $(Ag_{1-x}Li_x)(Nb_{1-y}Ta_y)O_3$, where $0.075 \leq x < 0.40$ and $0 \leq y < 0.20$, and an accessory component (not more than 5 parts by weight) containing at least one of a Mn oxide and a Si oxide has been already disclosed (Patent Document 1).

A piezoelectric element is generally required to have a high electromechanical coupling factor $k_{33}$, which indicates the conversion efficiency when converting electrical energy applied between electrodes of a piezoelectric to mechanical energy. In Patent Document 1, a piezoelectric element having an electromechanical coupling factor $k_{33}$ of 20% or more, which is the value needed to practical use, can be obtained by using a piezoelectric ceramic composition having the above-mentioned composition.

Further, Patent Document 2 discloses a ceramic material mainly used for a capacitor. The ceramic material contains two different types of components which are present in phases different from each other and each have a perovskite structure containing Ag in the A site and Nb and Ta in the B site. Specifically, the use of a composition $(Ag_{1-y}M^{III}_y)((Nb_{1-x}Ta_x)_{1-y}M^{IV}_y)O_3$ (where $M^{III}$ represents Bi or a rare-earth metal, $M^{IV}$ represents In, Sc or Ga, $0.35 \leq x \leq 0.5$ and $0 \leq y \leq 0.1$) or a composition $(Ag_{1-y}M^{III}_y)((Nb_{1-x}Ta_x)_{1-y}M^{IV}_y)O_3$ (where $M^{III}$ represents Ba, Ca, Pb, or Sr, $M^{IV}$ represents Sn or Zr, $0.35 \leq x \leq 0.5$ and $0 \leq y \leq 0.1$) is disclosed. In addition, it is disclosed that a microwave device having a high dielectric constant, i.e., $\in > 300$, a low dielectric loss and a small $TK_\in$ can be obtained by using a composition disclosed in Patent Document 1.

Patent Document 1: Japanese Unexamined Patent Application Publication No. 2002-68836

Patent Document 2: PCT Japanese Translation Patent Publication No. 2004

DISCLOSURE OF INVENTION

Problems to be Solved by the Invention

Generally, piezoelectric elements are required to have a high electromechanical coupling factor $k_{33}$ or a high piezoelectric constant $d_{33}$. When a piezoelectric element is used as a piezoelectric filter or a piezoelectric oscillator built into an electronic circuit, the piezoelectric element is also required to have an appropriately high relative dielectric constant $\in r$ ($= \in / \in_0$, $\in$: dielectric constant, $\in_0$: dielectric constant in vacuum).

In other words, the impedance of the piezoelectric element must be adjusted to a predetermined value in order to use the piezoelectric element as a piezoelectric filter or a piezoelectric oscillator on an electronic circuit. In the determination of the impedance, the capacitance of the piezoelectric element is a critical factor.

The capacitance of a piezoelectric element is, as is generally known, directly proportional to the relative dielectric constant $\in r$. Therefore, when the relative dielectric constant $\in r$ of a piezoelectric material is high, a desired impedance can be readily achieved even if the area of a piezoelectric element is decreased as a result of miniaturizing the element.

As described above, an appropriately high relative dielectric constant $\in r$ is necessary for miniaturizing a piezoelectric element since a desired impedance can be readily provided when the relative dielectric constant $\in r$ of a piezoelectric material is high.

The relative dielectric constant $\in r$ of the piezoelectric ceramic composition disclosed in Patent Document 1 has a low value of 350 or less. Therefore, disadvantageously, it is difficult to obtain a desired impedance.

In addition, some piezoelectric ceramic compositions in Patent Document 1 have a piezoelectric constant $d_{33}$ lower than 50. Furthermore, problematically, a high electromechanical coupling factor $k_{33}$ cannot be stably achieved.

In Patent Document 2, a ceramic material having a high relative dielectric constant $\in r$ is disclosed. However, the maximum relative dielectric constant $\in r$ is less than 600. Thus, a sufficient relative dielectric constant $\in r$ is not achieved. In addition, since the ceramic material disclosed in Patent Document 2 is used for a microwave device, appropriate piezoelectric properties such as an electromechanical coupling factor $k_{33}$ and a piezoelectric constant $d_{33}$ are disadvantageously, not provided.

The present invention has been accomplished in view of the above-mentioned problems. It is an object of the present invention to provide highly reliable lead-free piezoelectric ceramic compositions having an appropriately high relative dielectric constant and good piezoelectric properties such as the electromechanical coupling factor $k_{33}$ and piezoelectric constant $d_{33}$. It is another object of the present invention to provide piezoelectric elements fabricated using such piezoelectric ceramic compositions.

Means for Solving the Problem

The present inventor has conducted intensive studies on lead-free perovskite complex oxides (general formula: $ABO_3$) in order to achieve the above-mentioned objects and has found the fact that a piezoelectric ceramic composition having an appropriately high relative dielectric constant $\in r$ and a good piezoelectric property, stably showing a high electromechanical coupling factor $k_{33}$ and piezoelectric constant $d_{33}$ can be obtained even if the composition does not contain lead by using a composition in which a second complex oxide including an A site containing solid-dissolved Bi and K, Na, Li or Ag and a B site containing solid-dissolved Ti, Zr, Sn or Hf is solid-dissolved in a first complex oxide represented by $(Ag,Li)(Nb,Ta)O_3$ and the molar ratios of each component are suitably controlled.

In addition, the Bi solid-dissolved in the A site of the second complex oxide is a trivalent metal element and each of K, Na, Li and Ag solid-dissolved in the A site is a monovalent metal element, and each of Ti, Zr, Sn and Hf solid-dissolved in the B site is a tetravalent metal element. Therefore, it is suggested that a composition prepared by using metal elements having the same valencies as those of these metal elements may exhibit similar functions and effects.

The present invention has been accomplished based on these findings. The piezoelectric ceramic composition according to the present invention contains a main component represented by general formula $\{(1-n)(Ag_{1-x}Li_x)_m(Nb_{1-y}Ta_y)O_3\text{-}n(M1,M2)M3O_3\}$ (where M1 represents a trivalent metal element, M2 represents a monovalent metal element, and M3 represents a tetravalent metal element) and x, y, m, and n are defined to be $0.075 \leq x \leq 0.40$, $0 \leq y < 0.2$, $0.98 \leq m \leq 1.0$, and $0.01 \leq n \leq 0.1$.

Specifically, M1 is Bi, M2 is at least one element selected from the group consisting of K, Na, Li and Ag, and M3 is at least one element selected from the group consisting of Ti, Zr, Sn and Hf in the piezoelectric ceramic composition according to the present invention.

The present inventor has further conducted intensive studies and, as a result, has recognized the fact, similar to above, that a piezoelectric ceramic composition having an appropriately high relative dielectric constant $\in r$ and a good piezoelectric property, stably showing high electromechanical coupling factor $k_{33}$ and piezoelectric constant $d_{33}$ can be also obtained by using a perovskite oxide in which a divalent metal element (for example, at least one element selected from Ba, Sr, Ca and Mg) is solid-dissolved in the A site and a tetravalent metal element (for example, at least one element selected from Ti, Zr, Sn and Hf) is solid-dissolved in the Bi site, as the second complex oxide.

In other words, the piezoelectric ceramic composition according to the present invention may contain a main component represented by general formula $\{(1-n)(Ag_{1-x}Li_x)_m(Nb_{1-y}Ta_y)O_3\text{-}nM4M5O_3\}$ (where M4 represents a divalent metal element and M5 represents a tetravalent metal element) and x, y, m, and n are defined to be $0.075 \leq x < 0.40$, $0 \leq y < 0.2$, $0.98 \leq m \leq 1.0$, and $0.01 \leq n \leq 0.1$.

Specifically, M4 is at least one element selected from the group consisting of Ba, Sr, Ca and Mg, and M5 is at least one element selected from the group consisting of Ti, Zr, Sn and Hf in the piezoelectric ceramic composition according to the present invention.

Further, a piezoelectric element according to the present invention includes external electrodes disposed on the surface of a ceramic sintered body formed from the above-described piezoelectric ceramic composition.

In addition, the piezoelectric element according to the present invention includes an internal electrode buried in the ceramic sintered body.

Advantageous Effect of the Invention

According to the above-described piezoelectric material ceramic composition, a main component is represented by general formula $\{(1-n)(Ag_{1-x}Li_x)_m(Nb_{1-y}Ta_y)O_3\text{-}n(M1,M2)M3O_3\}$ (where M1 represents a trivalent metal element, M2 represents a monovalent metal element, and M3 represents a tetravalent metal element) and x, y, m, and n are defined to be $0.075 \leq x \leq 0.40$, $0 \leq y < 0.2$, $0.98 \leq m \leq 1.0$, and $0.01 \leq n \leq 0.1$. Therefore, the piezoelectric ceramic composition has an appropriately high relative dielectric constant $\in r$ and a good piezoelectric property, stably showing a high electromechanical coupling factor $k_{33}$ and piezoelectric constant $d_{33}$.

Further, M1 is Bi, M2 is at least one element selected from the group consisting of K, Na, Li and Ag, and M3 is at least one element selected from the group consisting of Ti, Zr, Sn and Hf. Therefore, the piezoelectric ceramic composition according to the present invention has a high relative dielectric constant of 600 or more, an electromechanical coupling factor $k_{33}$ of 25% or more, and a piezoelectric constant $d_{33}$ of 50 pC/N or more. The piezoelectric ceramic composition also has the good piezoelectric property of achieving a Curie temperature of 200° C. or more.

In addition, when the main component of a piezoelectric ceramic composition is represented by general formula $\{(1-n)(Ag_{1-x}Li_x)_m(Nb_{1-y}Ta_y)O_3\text{-}nM4M5O_3\}$ (where M4 represents a divalent metal element and M5 represents a tetravalent metal element) and x, y, m, and n are defined to be $0.075 \leq x < 0.40$, $0 \leq y < 0.2$, $0.98 \leq m \leq 1.0$, and $0.01 \leq n \leq 0.1$, the piezoelectric ceramic composition also has an appropriately high relative dielectric constant $\in r$ and a good piezoelectric property, stably showing high electromechanical coupling factor $k_{33}$ and piezoelectric constant $d_{33}$, similar to above.

Further, when M4 in the piezoelectric ceramic composition according to the present invention is at least one element selected from the group consisting of Ba, Sr, Ca and Mg and M5 is at least one element selected from the group consisting of Ti, Zr, Sn and Hf, the piezoelectric ceramic composition also has a high relative dielectric constant of 600 or more, an electromechanical coupling factor $k_{33}$ of 25% or more, a piezoelectric constant $d_{33}$ of 50 pC/N or more, and the good piezoelectric property of achieving a Curie temperature of 200° C. or more, similar to above.

Further, since external electrodes in the above-mentioned piezoelectric element are disposed on the surface of a ceramic sintered body formed from the above-described piezoelectric ceramic composition, various types of piezoelectric elements having a good piezoelectric property and excellent reliability can be provided.

Further, since an internal electrode is buried in the above-mentioned ceramic sintered body, various types of piezoelectric elements having a good piezoelectric property and excellent reliability can be provided, similar to above.

Figure 1:
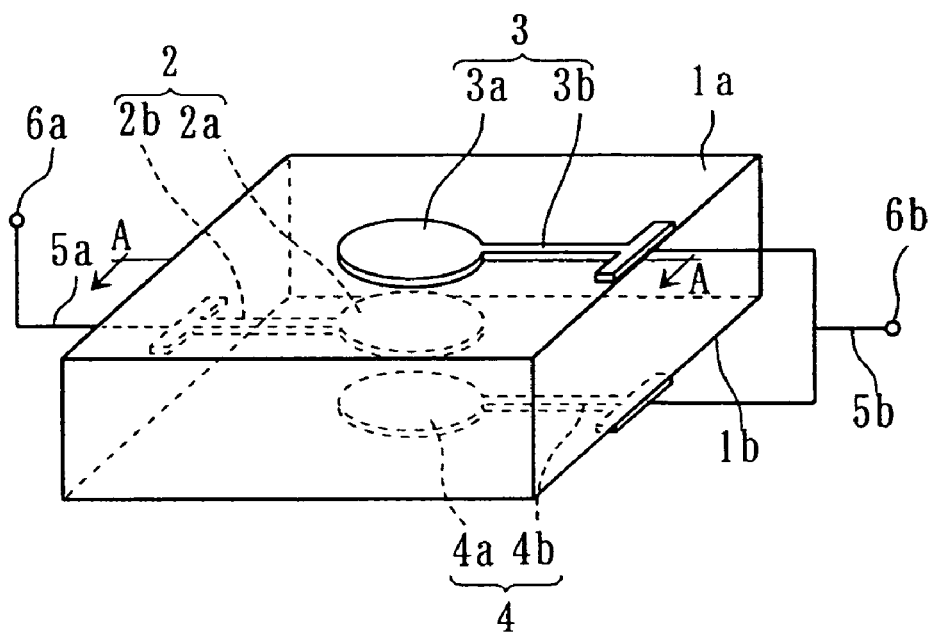
FIG. 1 is a perspective view of a piezoelectric oscillator as a piezoelectric element according to an embodiment of the present invention.

REFERENCE NUMERALS 1 piezoelectric ceramic (ceramic sintered body)
2 internal electrode
3 external electrode
4 external electrode

BEST MODE FOR CARRYING OUT THE INVENTION

Next, the embodiments of the present invention will be described in detail.

A piezoelectric ceramic composition according to a first embodiment of the present invention is represented by general formula (A):

$$(1\text{-}n)(Ag_{1-x}Li_x)_m(Nb_{1-y}Ta_y)O_3\text{-}n(M1,M2)M3O_3. \quad (A)$$

The molar amounts x, y, m and n satisfy the following expressions (1) to (4):

$$0.075 \leq x < 0.40; \quad (1)$$

$$0 \leq y < 0.2; \quad (2)$$

$$0.98 \leq m \leq 1.0; \text{ and} \quad (3)$$

$$0.01 \leq n \leq 0.1. \quad (4)$$

In other words, this piezoelectric ceramic composition is a composite including two types of complex oxides each having a perovskite structure. A second complex oxide (M1,M2)M3O$_3$ is solid-dissolved in a first complex oxide (Ag,Li)(Nb,Ta)O$_3$. M1 is a trivalent metal element, M2 is a monovalent metal element, and M3 is a tetravalent metal element, and hence the charges are compensated based on the chemical structure. However, the quantity ratio between M1 and M2 can slightly deviate from 1:1 as long as the properties are not influenced thereby.

Further, the piezoelectric ceramic composition according to the present invention is prepared so that general formula (A) satisfies expressions (1) to (4). Therefore, a piezoelectric ceramic composition having an appropriately high relative dielectric constant ∈r and a good piezoelectric property, stably showing a high electromechanical coupling factor k$_{33}$ and piezoelectric constant d$_{33}$ can be obtained.

Specifically, examples of the trivalent metal element M1 include Bi, La, Nd, Sm, Gd, Y and Sc. In particular, Bi is preferable. Examples of the monovalent metal element M2 include Li, Na, K and Ag. Examples of the tetravalent metal element M3 include Ti, Zr, Sn and Hf. By using these metal elements M1 to M3, a piezoelectric ceramic composition having a high relative dielectric constant ∈r of 600 or more, an electromechanical coupling factor k$_{33}$ of 25% or more, a piezoelectric constant d$_{33}$ of 50 pC/N or more, and the good piezoelectric property of achieving a Curie temperature of 200° C. or more can be provided.

Next, the grounds that the molar amounts of x, y and m of each element of the main component and the molar amount n of the second complex oxide (M1,M2)M3O$_3$ to the first complex oxide (Ag,Li)(Nb,Ta)O$_3$ are limited to the ranges defined by expressions (1) to (4) will be described.

(1) Molar Amount x

A piezoelectric element used under a high-temperature atmosphere is required to have a high Curie temperature Tc, which is the temperature at which a ferroelectric phase is converted to a paraelectric or antiferroelectric phase. When the molar amount x of Li is lower than 0.075, the Curie temperature Tc is decreased to 200° C. or less to deteriorate the temperature stability of a piezoelectric element.

On the other hand, when the molar amount x is 0.4 or more, the sintering property is deteriorated to decrease the isolation resistance. This makes a polarization treatment difficult.

Consequently, the molar amount x of Li is limited to 0.075≦x<0.40 in this embodiment.

(2) Molar Amount y

Since Ta has the same function as that of Nb, Ta may be contained in the piezoelectric ceramic composition of the present invention if necessary. However, when the molar amount y of Ta is 0.2 or more, the Curie temperature Tc is decreased to 200° C. or less to deteriorate the temperature stability of a piezoelectric element, as with the molar amount x.

Consequently, the molar amount y of Ta is limited to 0≦y<0.2 in this embodiment.

(3) Molar Amount m

When the molar ratio m of the A site component (Ag,Li) of the first complex oxide to the B site component (Nb,Ta) is lower than 0.98, the amount of the B site component (Nb,Ta) is too high. On the other hand, when the molar ratio m is higher than 1.0, the amount of the A site component is too high. In both cases, the sintering property is deteriorated to decrease the isolation resistance. This makes a polarization treatment difficult.

Consequently, the molar m is limited to 0.98≦m≦1.0 in this embodiment.

(4) Molar Amount n

The relative dielectric constant ∈r can be improved by adding an appropriate amount of a second complex oxide (M1,M2)M3O$_3$ to the first complex oxide (Ag,Li)(Nb,Ta)O$_3$. When the molar amount n of the second complex oxide (M1,M2)M3O$_3$ is higher than 0.1, a high electromechanical coupling factor k$_{33}$ cannot be maintained. This makes it improper to use the piezoelectric ceramic composition as a material of a piezoelectric filter or a piezoelectric oscillator. On the other hand, when the molar amount n is lower than 0.01, the relative dielectric constant ∈r becomes lower than 600. Thus, a desired relative dielectric constant ∈r cannot be provided. Therefore, impedance matching is deteriorated when the piezoelectric element is miniaturized.

Consequently, the molar amount n of the second complex oxide (M1,M2)M3O$_3$ in this embodiment, is limited to 0.01≦n≦0.1.

Next, a piezoelectric element fabricated using the above-described piezoelectric ceramic composition will be described.

Figure 2:
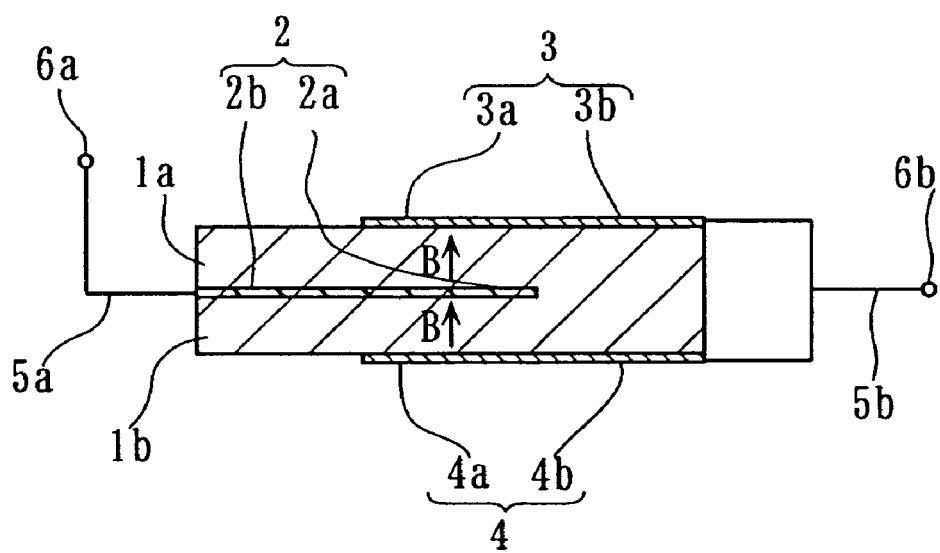
FIG. 2 is a cross-sectional view taken along the line A-A of FIG. 1.

FIG. 1 is a perspective view of a piezoelectric oscillator as the piezoelectric element according to the first embodiment. FIG. 2 is a cross-sectional view taken along the line A-A of FIG. 1.

In the piezoelectric element, two piezoelectric ceramics (piezoelectric ceramic sintered bodies 1a and 1b) which are polarized in the direction of arrows B are monolithically stacked so as to interpose an internal electrode 2 therebetween, and external electrodes 3 and 4 are formed on the outer surfaces of the piezoelectric ceramic material bodies 1a and 1b.

The internal electrode 2 has a disk-shaped vibrating portion 2a at approximately the center of the piezoelectric ceramic material bodies and a T-shaped extending portion 2b connected to the vibrating portion 2a at one point of the circumference thereof. The T-shaped extending portion 2b is exposed at one side surface of the piezoelectric oscillator.

The external electrodes 3 and 4 are formed on the outer surfaces of the first piezoelectric ceramic material body 1a and the second piezoelectric ceramic material body 1b, respectively, so as to face to each other through the first and second piezoelectric ceramic material bodies 1a and 1b. The external electrodes 3 and 4 have disk-shaped vibrating portions 3a and 4a, respectively, at approximately the centers of the piezoelectric ceramic material bodies and T-shaped extending portions 3b and 4b connected to the respective vibrating portions 3a and 4a at one point of each of the circumferences thereof. The extending portions 3b and 4b are exposed at the opposite side surface of the piezoelectric oscillator.

The extending portion 2b is connected to one external terminal 6a via a lead wire 5a, and the external portions 3b and 4b are connected to the other external terminal 6b via a lead wire 5b. Next, a method for fabricating the above-described piezoelectric oscillator will be described.

First, as starting materials, a Ag compound containing Ag, a Li compound containing Li, a Nb compound containing Nb, a Ta compound containing Ta, an M1 compound containing a metal element M1, an M2 compound containing a metal element M2, and an M3 compound containing a metal element M3 are prepared.

These compounds are then weighed to prepare a predetermined composition represented by general formula (A). The weighed compounds are placed in a ball mill containing a grinding medium such as zirconium and mixed in a solvent such as deionized water or ethanol for 4 to 24 hours to prepare slurry. Further, a dispersant such as sorbitan ester may be preferably added in this step, to further uniformly mix the compounds.

Then, the slurry is dried and calcined under an oxidizing atmosphere at a temperature of 800 to 1100° C. for 1 to 24 hours to obtain a calcined material. This calcined material, a solvent such as deionized water or ethanol, and a binder such as a polyvinyl alcohol resin are placed in a ball mill containing a grinding medium and are mixed and pulverized and then dried. The resulting dried powder is formed then into, for example, a prismatic shape by uniaxial pressing and then sintered under an oxidizing atmosphere at a temperature of 950 to 1200° C. for 3 to 10 hours. As a result, piezoelectric ceramics 1a and 1b formed from the above-described piezoelectric ceramic composition are fabricated.

Next, a conductive paste containing a conductive material such as Ag is prepared. The conductive paste is applied to the front and rear faces of the piezoelectric ceramics 1a and 1b and dried to form conductive layers. Then, polarization in the thickness direction of the piezoelectric ceramics 1a and 1b is carried out by applying a predetermined voltage at a predetermined temperature for a predetermined period of time.

The first piezoelectric ceramic 1a is then masked at portions corresponding to the external electrode 3 and the internal electrode 2. The conductive layer at the exposed portion was removed with a solvent. Thus, the external electrode 3 is formed on the front face of the first piezoelectric ceramic 1a and the internal electrode 2 is formed on the rear face of the first piezoelectric ceramic 1a. Similarly, the second piezoelectric ceramic 1b is masked at a portion corresponding to the external electrode 4, and the conductive layer at the exposing portion was removed with a solvent to form the external electrode 4 on the rear face of the second piezoelectric ceramic 1b.

Next, an epoxy adhesive is applied to the surface (on which the external electrode 4 is not disposed) of the second piezoelectric ceramic 1b. The second piezoelectric ceramic 1b and the first piezoelectric ceramic 1a are stacked and adhered to each other so that their polarization directions are the same direction. Thus, a piezoelectric oscillator is fabricated.

In the thus fabricated piezoelectric oscillator, the piezoelectric ceramics 1a and 1b are formed from the above-described piezoelectric ceramic composition. Therefore, the piezoelectric oscillator has an appropriately high relative dielectric constant ∈r and a good piezoelectric property stably showing high electromechanical coupling factor $k_{33}$ and piezoelectric constant $d_{33}$.

Specifically, a piezoelectric element having a high relative dielectric constant ∈r of 600 or more can be obtained. Therefore, the impedance matching becomes favorable to allow providing a piezoelectric oscillator of small size and having a desired impedance.

In addition, a highly reliable piezoelectric oscillator having an electromechanical coupling factor $k_{33}$ of 25% or more and a piezoelectric constant $d_{33}$ of 50 pC/N or more and also having the piezoelectric property of achieving a Curie temperature Tc of 200° C. or more can be provided.

Next, a second embodiment of the present invention will be described.

A piezoelectric ceramic composition according to the second embodiment of the present invention is represented by general formula (B):

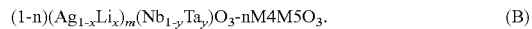

$$(1-n)(Ag_{1-x}Li_x)_m(Nb_{1-y}Ta_y)O_3-nM4M5O_3. \quad (B)$$

In the formula, M4 represents a divalent metal element, and M5 represents a tetravalent metal element. For the same reasons as those in the first embodiment, the molar amounts x, y, and n and molar ratio m, are adjusted to satisfy the above-mentioned expressions (1) to (4).

In other words, in the second embodiment, a perovskite oxide in which a divalent metal element M4 is solid-dissolved in the A site of the second complex oxide and a tetravalent metal element M5 is solid-dissolved in the B site is used as the second complex oxide. When the second complex oxide is thus in a form represented by composition formula M4M5O₃, as in the first embodiment, a piezoelectric ceramic composition having an appropriately high relative dielectric constant ∈r and a good piezoelectric property, stably showing high electromechanical coupling factor $k_{33}$, piezoelectric constant $d_{33}$ and also Curie temperature Tc, can be provided.

Examples of the divalent metal element M4 include Ba, Sr, Ca and Mg. Examples of the tetravalent metal element M5 include Ti, Zr, Sn and Hf. By using these metal elements, as in the first embodiment, a piezoelectric ceramic composition having a high relative dielectric constant ∈r of 600 or more and having a piezoelectric property achieving an electromechanical coupling factor $k_{33}$ of 25% or more, a piezoelectric constant $d_{33}$ of 50 pC/N or more, and a Curie temperature Tc of 200° C. or more, can be provided.

Further, a piezoelectric oscillator which is similar to that shown in FIGS. 1 and 2 can be provided by using the piezoelectric ceramic composition (general formula (B)) according to the second embodiment, as in the first embodiment.

The present invention is not limited to the above-described embodiments. As an embodiment of the piezoelectric ceramic composition, a solid-solution in which a second complex oxide (M1,M2)M3O₃ or M4M5O₃ is solid-dissolved in a first complex oxide (Ag,Li)(Nb,Ta)O₃ is preferable as described above. However, the second complex oxide (M1, M2)M3O₃ or M4M5O₃ may not be completely solid-solved in the first complex oxide (Ag,Li)(Nb,Ta)O₃ and may be partially present in a grain boundary. In addition, the second complex oxide (M1,M2)M3O₃ or M4M5O₃ may be present as a mixture with the first complex oxide (Ag,Li)(Nb,Ta)O₃.

In the above-described embodiments, the dielectric ceramics 1a and 1b are formed by press forming. However, the piezoelectric ceramic material body may be formed by sheet forming. In other words, the piezoelectric ceramic material body may be fabricated by wet pulverizing ceramic raw materials to form ceramic slurry, processing the resulting ceramic slurry into ceramic green sheets by a doctor-blade method, stacking a predetermined number of the ceramic green sheets, and sintering the stacked green sheets.

In the above-mentioned embodiments, a piezoelectric oscillator is described as one example of the piezoelectric element, but the same can be similarly applied to piezoelectric actuators, piezoelectric filters, piezoelectric buzzers, and piezoelectric sensors.

Next, examples of the present invention will be specifically described.

EXAMPLE 1

First, powders of $Ag_2O$, $Li_2CO_3$, $Nb_2O_5$, $Ta_2O_5$, $Bi_2O_3$, $Na_2CO_3$, $K_2CO_3$, $TiO_2$, $ZrO_2$, $SnO_2$ and $HfO_2$ were weighed to obtain compositions shown in Table 1. Each of the weighed compositions was calcined under an oxidizing atmosphere at a temperature of 850 to 1100° C. for 10 hours using an electric furnace to obtain a calcined material.

This calcined material was wet pulverized. Then, 100 parts by weight of this calcined material and 5 parts by weight of a polyvinyl alcohol resin serving as a binder were mixed. The resulting mixture was dried and then formed into a prismatic shape with 12 mm in height, 12 mm in width, and 2.5 mm in thickness by uniaxial pressing at a pressure of $9.8 \times 10^8$ Pa and then sintered under an oxidizing atmosphere at a temperature of 950 to 1200° C. for 3 to 10 hours to obtain a piezoelectric ceramic.

Then, Ag paste was applied to both front and rear faces of the piezoelectric ceramic and then baked at 800° C. Next, polarization treatment was conducted by applying a direct current voltage of 20 to 100 kV/cm to the piezoelectric ceramic in an insulating oil bath at a temperature of 40 to 150° C. for 10 to 30 minutes.

Next, the piezoelectric ceramic was cut into prisms with 2 mm in height, 2 mm in width, and 3 mm in thickness with a cutter. Thus, piezoelectric elements of sample Nos. 1 to 38 were provided.

Then, each of the piezoelectric elements of sample Nos. 1 to 38 was measured for relative dielectric constant $\in r$, electromechanical coupling factor $k_{33}$ for thickness vibration, piezoelectric constant $d_{33}$ for thickness vibration, and Curie temperature Tc.

The relative dielectric constant $\in r$, electromechanical coupling factor $k_{33}$, and piezoelectric constant $d_{33}$ were determined by a resonance-antiresonance method using an RF impedance analyzer (HP4194A: Hewlett-Packard).

In addition, the temperature dependence of electromechanical coupling factor $k_{33}$ was determined, and the temperature at which the electromechanical coupling factor $k_{33}$ becomes zero due to an increase in the temperature, namely, a temperature at which the piezoelectric property disappears was determined as the Curie temperature Tc.

Table 1 shows the compositions of sample Nos. 1 to 38 and the measurement results.

TABLE 1

| | $(1 - n)(Ag_{1-x}Li_x)_m(Nb_{1-y}Ta_y)O_3$ -$n(M_1M_2)M_3O_3$ | | | | | | | | | |
|---|---|---|---|---|---|---|---|---|---|---|
| | x | y | m | n | $M_1$ | $M_2$ | $M_3$ | | (%) | (pC/N) | (° C.) |
| 1* | 0.100 | 0.00 | 1.0 | 0.00 | — | — | — | 304 | 41 | 55 | 290 |
| 2 | 0.075 | 0.00 | 1.0 | 0.10 | Bi | Na | Ti | 800 | 45 | 110 | 230 |
| 3 | 0.100 | 0.00 | 1.0 | 0.05 | Bi | Na | Ti | 1000 | 48 | 100 | 270 |
| 4 | 0.150 | 0.00 | 1.0 | 0.01 | Bi | Na | Ti | 750 | 35 | 70 | 300 |
| 5 | 0.200 | 0.00 | 1.0 | 0.05 | Bi | Na | Ti | 650 | 28 | 65 | 290 |
| 6 | 0.300 | 0.00 | 1.0 | 0.10 | Bi | Na | Ti | 1500 | 30 | 70 | 300 |
| 7 | 0.100 | 0.05 | 1.0 | 0.05 | Bi | Na | Ti | 650 | 44 | 85 | 260 |
| 8 | 0.100 | 0.10 | 1.0 | 0.01 | Bi | Na | Ti | 700 | 45 | 50 | 250 |
| 9* | 0.100 | 0.05 | 1.0 | 0.20 | Bi | Na | Ti | 450 | 15 | 45 | 140 |
| 10 | 0.075 | 0.05 | 1.0 | 0.05 | Bi | Na | Ti | 650 | 40 | 60 | 220 |
| 11 | 0.150 | 0.10 | 1.0 | 0.05 | Bi | Na | Ti | 680 | 45 | 55 | 200 |
| 12* | 0.400 | 0.10 | 1.0 | 0.05 | Bi | Na | Ti | | | | |
| 13* | 0.100 | 0.00 | 1.0 | 0.15 | Bi | Na | Ti | 2000 | 18 | 30 | 100 |
| 14 | 0.100 | 0.00 | 1.0 | 0.05 | Bi | Li | Ti | 950 | 45 | 95 | 280 |
| 15 | 0.150 | 0.00 | 1.0 | 0.01 | Bi | K | Ti | 700 | 30 | 65 | 310 |
| 16 | 0.100 | 0.00 | 1.0 | 0.05 | Bi | Ag | Ti | 950 | 43 | 90 | 280 |
| 17 | 0.150 | 0.00 | 1.0 | 0.01 | Bi | Na | Zr | 800 | 38 | 75 | 310 |
| 18 | 0.075 | 0.05 | 1.0 | 0.05 | Bi | Na | Zr | 680 | 43 | 65 | 230 |
| 19 | 0.150 | 0.10 | 1.0 | 0.05 | Bi | Na | Zr | 700 | 46 | 60 | 210 |
| 20 | 0.100 | 0.00 | 0.98 | 0.05 | Bi | Na | Ti | 1000 | 48 | 100 | 270 |
| 21 | 0.150 | 0.00 | 0.98 | 0.01 | Bi | Na | Ti | 750 | 35 | 70 | 300 |
| 22 | 0.150 | 0.00 | 0.98 | 0.01 | Bi | K | Ti | 700 | 30 | 65 | 310 |
| 23 | 0.100 | 0.00 | 0.98 | 0.05 | Bi | Ag | Ti | 950 | 43 | 90 | 280 |
| 24 | 0.150 | 0.00 | 0.98 | 0.01 | Bi | Na | Zr | 800 | 38 | 75 | 310 |
| 25* | 0.100 | 0.05 | 0.97 | 0.05 | Bi | Na | Ti | | | | |
| 26 | 0.100 | 0.00 | 0.98 | 0.05 | Bi | Na/Li(0.5/0.5) | Ti | 980 | 45 | 90 | 260 |
| 27 | 0.150 | 0.00 | 0.98 | 0.01 | Bi | Na/K(0.5/0.5) | Ti | 780 | 35 | 65 | 300 |
| 28 | 0.150 | 0.00 | 0.98 | 0.01 | Bi | Na/Ag(0.5/0.5) | Ti | 680 | 28 | 60 | 300 |
| 29 | 0.100 | 0.00 | 0.98 | 0.05 | Bi | Li/Ag(0.5/0.5) | Ti | 900 | 40 | 85 | 270 |
| 30 | 0.100 | 0.00 | 1.0 | 0.05 | Bi | Li | Zr | 900 | 42 | 90 | 270 |
| 31 | 0.150 | 0.00 | 1.0 | 0.01 | Bi | K | Zr | 650 | 26 | 60 | 310 |
| 32 | 0.100 | 0.00 | 1.0 | 0.05 | Bi | Ag | Zr | 900 | 40 | 85 | 280 |
| 33 | 0.075 | 0.00 | 1.0 | 0.10 | Bi | Na | Hf | 780 | 40 | 80 | 210 |
| 34 | 0.100 | 0.00 | 1.0 | 0.05 | Bi | Na | Hf | 950 | 42 | 85 | 230 |
| 35 | 0.100 | 0.00 | 1.0 | 0.05 | Bi | Na | Sn | 900 | 35 | 70 | 240 |
| 36 | 0.150 | 0.00 | 1.0 | 0.01 | Bi | Na | Sn | 650 | 27 | 55 | 270 |
| 37* | 0.050 | 0.00 | 1.0 | 0.01 | Bi | Na | Ti | 300 | 43 | 60 | 150 |
| 38* | 0.100 | 0.20 | 1.0 | 0.01 | Bi | Na | Ti | 250 | 45 | 55 | 160 |

*

As is obvious from Table 1, it was confirmed that since the composition of sample No. 1 did not contain the second complex oxide (M1,M2)M3O$_3$, and the relative dielectric constant ∈r was a low value of 304.

Further, it was confirmed that since the composition of sample No. 9 had a high n of 0.20, the Curie temperature Tc was a low value of 140° C. and the relative dielectric constant ∈r, the electromechanical coupling factor k$_{33}$, and the piezoelectric constant d$_{33}$ were also low.

In the composition of sample No. 12, the x was a high value of 0.400 and, therefore, the sintering property was poor and the isolation resistance was low. As a result, the polarization treatment could not be carried out.

It was confirmed that since the n in the composition of sample No. 13 was 0.15, the molar amount of the second complex oxide (M1,M2)M3O$_3$ was excessive and decreased the electromechanical coupling factor k$_{33}$ to 18% and also decreased the piezoelectric constant d$_{33}$ and the Curie temperature Tc.

In the composition of sample No. 25, since the m was a low value of 0.97, the B site composition (Na,Ta) of the first complex oxide was excessive. Therefore, the sintering property was deteriorated and the isolation resistance was decreased. As a result, the polarization treatment could not be carried out.

In the composition of sample No. 37, it was confirmed that since the x was 0.050, which was too small, the Curie temperature Tc was a low value of 150° C. and the relative dielectric constant ∈r, the electromechanical coupling factor k$_{33}$, and the piezoelectric constant d$_{33}$ were also low.

In the composition of sample No. 38, it was confirmed that since the y was a high value of 0.2, the Curie temperature Tc was a low value of 160° C. and the relative dielectric constant ∈r, the electromechanical coupling factor k$_{33}$, and the piezoelectric constant d$_{33}$ were also low.

On the other hand, it was confirmed that since in each composition of sample Nos. 2 to 8, 10, 11, 14 to 24, and 26 to 36, the x, y, m and n were within the ranges of the present invention, i.e., 0.075≦x<0.4, 0≦y<0.2, 0.98≦m≦1.0, and 0.01≦n≦0.1, and the second complex oxide (M1,M2)M3O$_3$ was solid-dissolved in the first complex oxide (Ag$_{1-x}$Li$_x$)(Nb$_{1-y}$Ta$_y$)O$_3$; the dielectric element had a high relative dielectric constant ∈r of 600 or more and was superior in piezoelectric properties so that the electromechanical coupling factor k$_{33}$ was 25% or more, the piezoelectric constant d$_{33}$ was 50 pC/N or more, and the Curie temperature Tc was 200° C. or more.

EXAMPLE 2

Powders of Ag$_2$O, Li$_2$CO$_3$, Nb$_2$O$_5$, Ta$_2$O$_5$, BaCO$_3$, SrCO$_3$, CaCO$_3$, MgO, TiO$_2$, ZrO$_2$, SnO$_2$ and HfO$_2$ were weighed to obtain compositions shown in Table 2. Each of the weighed compositions was calcined under an oxidizing atmosphere at a temperature of 800 to 1100° C. for 10 hours using an electric furnace to obtain a calcined material.

Each piezoelectric elements of sample Nos. 41 to 80 were fabricated by the same method and process as those in Example 1.

Then, each of the piezoelectric elements of sample Nos. 41 to 80 was measured for relative dielectric constant ∈r, electromechanical coupling factor k$_{33}$ for thickness vibration, piezoelectric constant d$_{33}$ for thickness vibration, and Curie temperature Tc by the same method and process as those in Example 1.

Table 2 shows the compositions of sample Nos. 41 to 80 and the measurement results.

TABLE 2

| | (1 − n)(Ag$_{1-x}$Li$_x$)$_m$(Nb$_{1-y}$Ta$_y$)O$_3$ -nM4M5O$_3$ | | | | | | | | |
|---|---|---|---|---|---|---|---|---|---|
| | x | y | m | n | M4 | M5 | | (%) | (pC/N) | (° C.) |
| 41* | 0.100 | 0.00 | 1.0 | 0.00 | — | — | 304 | 41 | 55 | 290 |
| 42 | 0.075 | 0.00 | 1.0 | 0.10 | Ba | Ti | 800 | 47 | 130 | 210 |
| 43 | 0.100 | 0.00 | 1.0 | 0.05 | Ba | Ti | 950 | 49 | 110 | 250 |
| 44 | 0.150 | 0.00 | 1.0 | 0.01 | Ba | Ti | 700 | 37 | 80 | 300 |
| 45 | 0.200 | 0.00 | 1.0 | 0.05 | Ba | Ti | 630 | 31 | 75 | 280 |
| 46 | 0.300 | 0.00 | 1.0 | 0.10 | Ba | Ti | 1500 | 34 | 90 | 290 |
| 47 | 0.100 | 0.05 | 1.0 | 0.05 | Ba | Ti | 640 | 47 | 100 | 250 |
| 48 | 0.100 | 0.10 | 1.0 | 0.01 | Ba | Ti | 670 | 47 | 55 | 250 |
| 49* | 0.100 | 0.20 | 1.0 | 0.01 | Ba | Ti | 400 | 21 | 50 | 130 |
| 50* | 0.100 | 0.45 | 1.0 | 0.01 | Ba | Ti | 550 | | | |
| 51* | 0.000 | 0.15 | 1.0 | 0.1 | Ba | Ti | 400 | | | |
| 52 | 0.075 | 0.05 | 1.0 | 0.05 | Ba | Ti | 620 | 43 | 70 | 210 |
| 53 | 0.150 | 0.10 | 1.0 | 0.05 | Ba | Ti | 660 | 48 | 65 | 200 |
| 54* | 0.400 | 0.10 | 1.0 | 0.05 | Ba | Ti | | | | |
| 55* | 0.100 | 0.00 | 1.0 | 0.15 | Ba | Ti | 1800 | 20 | 40 | 100 |
| 56 | 0.100 | 0.00 | 1.0 | 0.05 | Ba/Sr(0.5/0.5) | Ti | 880 | 46 | 105 | 260 |
| 57 | 0.150 | 0.00 | 1.0 | 0.01 | Ca | Ti | 640 | 32 | 70 | 290 |
| 58 | 0.100 | 0.00 | 1.0 | 0.05 | Mg | Ti | 860 | 44 | 95 | 260 |
| 59 | 0.150 | 0.00 | 1.0 | 0.01 | Ba | Zr | 770 | 40 | 80 | 300 |
| 60 | 0.075 | 0.05 | 1.0 | 0.05 | Ba | Zr | 650 | 46 | 80 | 220 |
| 61 | 0.150 | 0.10 | 1.0 | 0.05 | Ba | Zr | 670 | 48 | 75 | 210 |
| 62 | 0.100 | 0.00 | 0.98 | 0.05 | Ba | Ti | 910 | 50 | 115 | 250 |
| 63 | 0.150 | 0.00 | 0.98 | 0.01 | Ba | Ti | 720 | 37 | 80 | 280 |
| 64 | 0.150 | 0.00 | 0.98 | 0.01 | Sr | Ti | 630 | 32 | 70 | 290 |
| 65 | 0.100 | 0.00 | 0.98 | 0.05 | Ba/Ca(0.5/0.5) | Ti | 890 | 45 | 100 | 270 |
| 66 | 0.150 | 0.00 | 0.98 | 0.01 | Ba | Zr | 740 | 40 | 85 | 290 |
| 67* | 0.100 | 0.05 | 0.97 | 0.05 | Ba | Ti | | | | |
| 68 | 0.100 | 0.00 | 0.98 | 0.05 | Ba/Mg(0.5/0.5) | Ti | 910 | 46 | 95 | 240 |
| 69 | 0.150 | 0.00 | 0.98 | 0.01 | Ca/Sr(0.5/0.5) | Ti | 700 | 36 | 70 | 290 |
| 70 | 0.150 | 0.00 | 0.98 | 0.01 | Ca/Mg(0.5/0.5) | Ti | 600 | 29 | 65 | 290 |
| 71 | 0.100 | 0.00 | 0.98 | 0.05 | Sr/Mg(0.5/0.5) | Ti | 820 | 41 | 90 | 250 |
| 72 | 0.100 | 0.00 | 1.0 | 0.05 | Ba | Zr | 840 | 44 | 100 | 250 |

TABLE 2-continued $(1-n)(Ag_{1-x}Li_x)_m(Nb_{1-y}Ta_y)O_3\text{-}nM4M5O_3$

|    | x     | y    | m   | n    | M4                              | M5 | (%) | (pC/N) | (° C.) |
|----|-------|------|-----|------|---------------------------------|----|-----|--------|--------|
| 73 | 0.150 | 0.00 | 1.0 | 0.01 | Ba                              | Zr | 620 | 29     | 65     | 300 |
| 74 | 0.100 | 0.00 | 1.0 | 0.05 | Ba/Ca/Sr/Mg (0.25/0.25/0.25/0.25) | Zr | 870 | 42     | 95     | 260 |
| 75 | 0.075 | 0.00 | 1.0 | 0.10 | Ba                              | Hf | 780 | 43     | 95     | 200 |
| 76 | 0.100 | 0.00 | 1.0 | 0.05 | Ba                              | Hf | 900 | 44     | 95     | 210 |
| 77 | 0.100 | 0.00 | 1.0 | 0.05 | Ba                              | Sn | 870 | 38     | 80     | 220 |
| 78 | 0.150 | 0.00 | 1.0 | 0.01 | Ba                              | Sn | 620 | 30     | 60     | 250 |
| 79*| 0.050 | 0.00 | 1.0 | 0.01 | Ba                              | Ti | 280 | 45     | 70     | 140 |
| 80*| 0.100 | 0.00 | 1.1 | 0.05 | Ba                              | Ti |     |        |        |     |

*

Since the composition of sample No. 41 did not contain the second complex oxide $M4M5O_3$, the relative dielectric constant $\epsilon r$ was a low value of 304, as in the composition of sample No. 1 in Example 1.

In the composition of sample No. 49, it was confirmed that since t y was a high value of 0.20, the Curie temperature Tc was a low value of 130° C. and the relative dielectric constant $\epsilon r$, the electromechanical coupling factor $k_{33}$, and the piezoelectric constant $d_{33}$ were also low.

In the composition of sample No. 50, y was a high value of 0.45. Therefore, resonance-antiresonance was not recognized in the polarization treatment, and none of electromechanical coupling factor $k_{33}$, piezoelectric constant $d_{33}$, or Curie temperature Tc could be measured.

In the composition of sample No. 51, x was zero. Therefore, as in composition of sample. No. 50, resonance-antiresonance was not recognized in the polarization treatment, and none of electromechanical coupling factor $k_{33}$, piezoelectric constant $d_{33}$, or Curie temperature Tc could be measured.

In the composition of sample No. 54, x was a high value of 0.400 and, therefore, the sintering property was poor and the isolation resistance was low. As a result, the polarization treatment could not be carried out.

In the composition of sample No. 55, it was confirmed that since n was 0.15 and therefore the amount of the second complex oxide $M4M5O_3$ was excessive, the electromechanical coupling factor $k_{33}$ was decreased to 20% and the piezoelectric constant $d_{33}$ and the Curie temperature Tc were also decreased.

In the composition of sample No. 67, since m was a low value of 0.97, the B site composition (Na,Ta) of the first complex oxide was excessive. Therefore, the sintering property was deteriorated and the isolation resistance was decreased. As a result, the polarization treatment could not be carried out.

In the composition of sample No. 79, it was confirmed that since x was 0.050, which was too small, the Curie temperature Tc was a low value of 140° C. and the relative dielectric constant $\epsilon r$, the electromechanical coupling factor $k_{33}$, and the piezoelectric constant $d_{33}$ were also low.

In the composition of sample No. 80, since m was a high value of 1.1, the A site composition of the first complex oxide was excessive. Therefore, the sintering property was deteriorated and the isolation resistance was decreased. As a result, the polarization treatment could not be carried out.

On the other hand, it was confirmed that since in each of the compositions of sample Nos. 42 to 48, 52, 53, 56 to 66, and 68 to 78, the x, y, m and n were within the ranges of the present invention, i.e., $0.075 \leq x < 0.4$, $0 \leq y < 0.2$, $0.98 \leq m \leq 1.0$, and $0.01 \leq n \leq 0.1$, and the second complex oxide $M4M5O_3$ was solid-dissolved in the first complex oxide $(Ag_{1-x}Li_x)_m(Nb_{1-y}Ta_y)O_3$; the dielectric element had a high relative dielectric constant $\epsilon r$ of 600 or more and was superior in piezoelectric properties so that the electromechanical coupling factor $k_{33}$ was 25% or more, the piezoelectric constant $d_{33}$ was 50 pC/N or more, and the Curie temperature Tc was 200° C. or more. In addition, it was confirmed that the above-described desired piezoelectric properties can be provided even when more than one metal elements were solid-dissolved in the A site composition of the second complex oxide $M4M5O_3$ (sample Nos. 56, 65, 68 to 71, and 74).

The invention claimed is:

1. A piezoelectric ceramic composition comprising a main component represented by the general formula $$\{(1-n)(Ag_{1-x}Li_x)_m(Nb_{1-y}Ta_y)O_3\text{-}nX\}$$

in which X is $(M1,M2)M3O_3$ or $M4M5O_3$, M1 represents a trivalent metal element, M2 represents a monovalent metal element, M3 and M5 represent a tetravalent metal element, and M4 represents a divalent metal element, and wherein x, y, m and n are:

$0.075 \leq x < 0.40$;

$0 \leq y < 0.2$;

$0.98 \leq m \leq 1.0$; and $0.01 \leq n \leq 0.1$.

2. The piezoelectric ceramic composition according to claim 1, wherein X is $(M1,M2)M3\ M3O_3$.

3. The piezoelectric ceramic composition according to claim 2, wherein M1 is Bi, M2 is at least one element selected from the group consisting of K, Na, Li and Ag, and M3 is at least one element selected from the group consisting of Ti, Zr, Sn and Hf.

4. The piezoelectric ceramic composition according to claim 3, wherein M2 comprises Na and M3 is one element of said group.

5. The piezoelectric ceramic composition according to claim 4, wherein $0.1 \leq x < 0.2$; $0 \leq y < 0.1$; and $0.05 \leq n \leq 0.1$.

6. The piezoelectric ceramic composition according to claim 5, wherein M3 is Ti.

7. A piezoelectric ceramic composition according to claim 1 in which X is $M4M5O_3$.

8. The piezoelectric ceramic composition according to claim 7, wherein M4 is at least one element selected from the group consisting of Ba, Sr, Ca and Mg, and M5 is at least one element selected from the group consisting of Ti, Zr, Sn and Hf.

9. The piezoelectric ceramic composition according to claim 8, wherein M3 comprises Ba and M5 is one element of said group.

10. The piezoelectric ceramic composition according to claim 9, wherein $0.1 \leq x < 0.2$; $0 \leq y < 0.1$; and $0.05 \leq n < 0.1$.

11. The piezoelectric ceramic composition according to claim 10, wherein M5 is Ti.

12. A piezoelectric element comprising a ceramic sintered body formed from a piezoelectric ceramic composition according to claim 1 and external electrodes disposed on the surface of the ceramic sintered body.

13. The piezoelectric element according to claim 12, wherein an internal electrode is buried in the ceramic sintered body.

14. A piezoelectric element comprising a ceramic sintered body formed from a piezoelectric ceramic composition according to claim 2 and external electrodes disposed on the surface of the ceramic sintered body.

15. The piezoelectric element according to claim 14, wherein an internal electrode is buried in the ceramic sintered body.

16. A piezoelectric element comprising a ceramic sintered body formed from a piezoelectric ceramic composition according to claim 6, external electrodes disposed on the surface of the ceramic sintered body and an internal electrode is buried in the ceramic sintered body.

17. A piezoelectric element comprising a ceramic sintered body formed from a piezoelectric ceramic composition according to claim 7 and external electrodes disposed on the surface of the ceramic sintered body.

18. The piezoelectric element according to claim 17, wherein an internal electrode is buried in the ceramic sintered body.

19. A piezoelectric element comprising a ceramic sintered body formed from a piezoelectric ceramic composition according to claim 11, external electrodes disposed on the surface of the ceramic sintered body, and an internal electrode is buried in the ceramic sintered body.

* * * * *